United States Patent [19]

Yamamura et al.

[11] Patent Number: 5,362,983
[45] Date of Patent: Nov. 8, 1994

[54] THERMOELECTRIC CONVERSION MODULE WITH SERIES CONNECTION

[76] Inventors: Akira Yamamura, c/o Nippon Ferrofluidics Corporation, 17-22, Akasaka 2-chome, Minato-ku, Tokyo, 107, Japan; John Baldwin, c/o International Thermoelectric Incorporated, 131 Stedman St., Chelmsford, Mass. 01824

[21] Appl. No.: 191,066

[22] Filed: Feb. 3, 1994

Related U.S. Application Data

[63] Continuation of Ser. No. 858,066, Mar. 26, 1992, abandoned.

[30] Foreign Application Priority Data

Mar. 27, 1991 [JP] Japan ................. 3-133776

[51] Int. Cl.$^5$ ............................ H01L 29/66
[52] U.S. Cl. ..................... 257/414; 257/467; 257/468; 257/469; 136/203; 136/204; 136/212; 136/225; 62/3.2; 62/3.3; 62/3.6
[58] Field of Search ............. 257/467, 414, 468, 469; 136/203, 204, 225, 212; 62/3.2, 3.3, 3.4, 3.6, 3.7

[56] References Cited

U.S. PATENT DOCUMENTS

| | | | |
|---|---|---|---|
| 3,136,134 | 6/1964 | Smith | 257/467 X |
| 4,859,250 | 8/1989 | Buist | 62/3.3 X |
| 5,012,325 | 4/1991 | Mansuria et al. | 62/3.2 X |
| 5,168,339 | 12/1992 | Yokotani et al. | 257/467 X |

FOREIGN PATENT DOCUMENTS

1323569 3/1963 France ................. 62/3.2

*Primary Examiner*—William Mintel
*Attorney, Agent, or Firm*—Nikaido, Marmelstein, Murray & Oram

[57] ABSTRACT

In the conventional thermoelectric conversion module, P-type thermoelectric semiconductor chips and N-type thermoelectric semiconductor chips are alternately arranged in both the longitudinal and the transverse directions. Consequently, assembling work is complicated and there arises the problem in quality that erroneous types of chips are arranged. In the present invention, therefore, each of either rows of chips or columns of chips is constituted by thermoelectric semiconductor chips of the same type, thereby to improve assembling workability as well as to prevent erroneous arrangement. Furthermore, as a preferred fabricating method, bar-shaped thermoelectric semiconductors are used and are jointed to one substrate and then, are electrically disconnected between the leads.

3 Claims, 8 Drawing Sheets

THERMOELECTRIC CONVERSION MODULE WITH SERIES CONNECTION

This application is a continuation of application Ser. No. 07/858,066 filed Mar. 26, 1992, now abandoned.

BACKGROUND OF THE INVENTION

1. Field of the Invention

The present invention relates to thermoelectric conversion modules and a method of fabricating the same.

2. Description of the Prior Art

Figure 13:
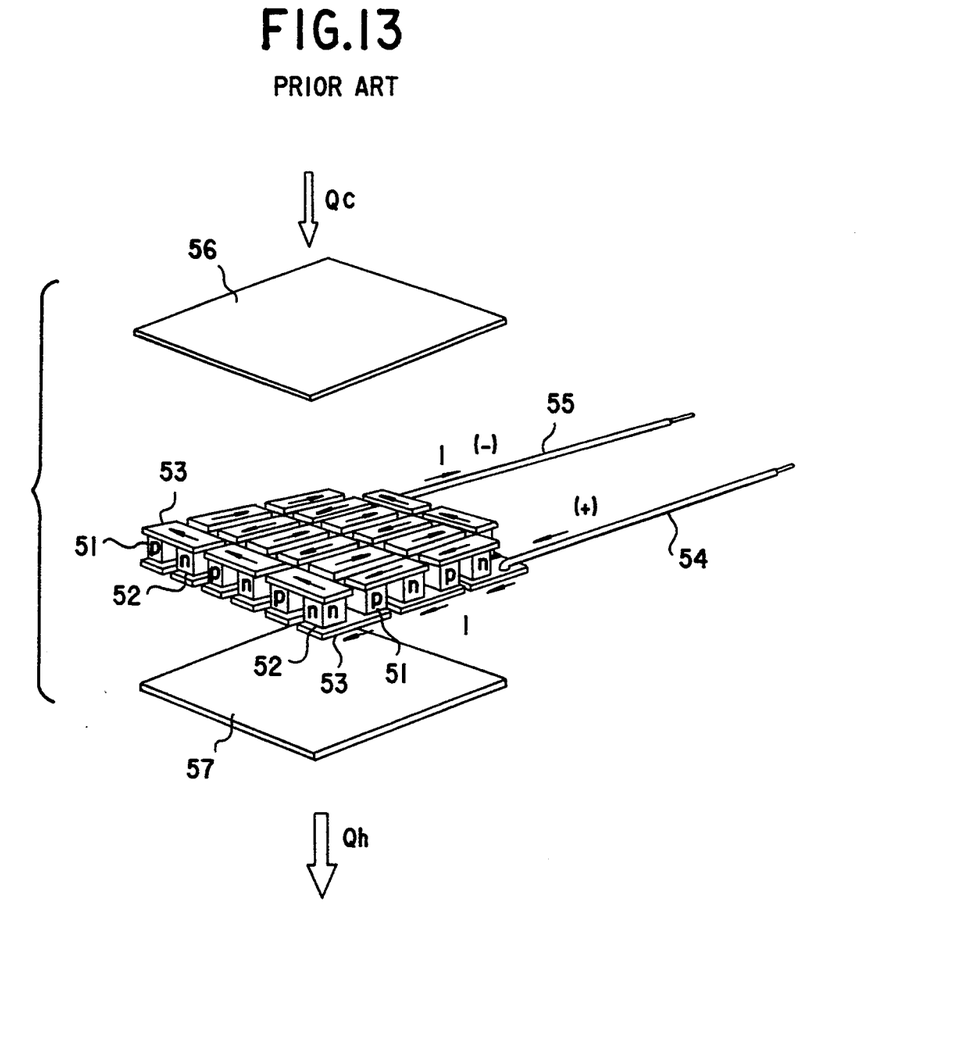
FIG. 13 is a perspective view showing an example of the construction of a conventional thermoelectric conversion module.

A thermoelectric conversion module is an apparatus for absorbing heat and generating heat utilizing the Peltier effect by passing a current between terminals. FIG. 13 shows the specific construction of the thermoelectric conversion module. The thermoelectric conversion module shown in FIG. 13 is so constructed that P-type thermoelectric semiconductor chips 51 and N-type thermoelectric semiconductor chips 52 are alternately arranged and the chips 51 and 62 are connected to each other by leads 53 to absorb heat by conducting electricity from the N-type thermoelectric semiconductor chips 52 to the P-type thermoelectric semiconductor chips 51 on one of the side surfaces and to generate heat by conducting electricity from the P-type thermoelectric semiconductor chips 51 to the N-type thermoelectric semiconductor chips 52 on the other side surface. In FIG. 13, reference numerals 54 and 55 respectively denote a plus-side lead wire and a minus-side lead wire, and reference numerals 56 and 57 respectively denote a ceramic substrate on the heat-absorbing side and a ceramic substrate on the heat-generating side.

Figure 14:
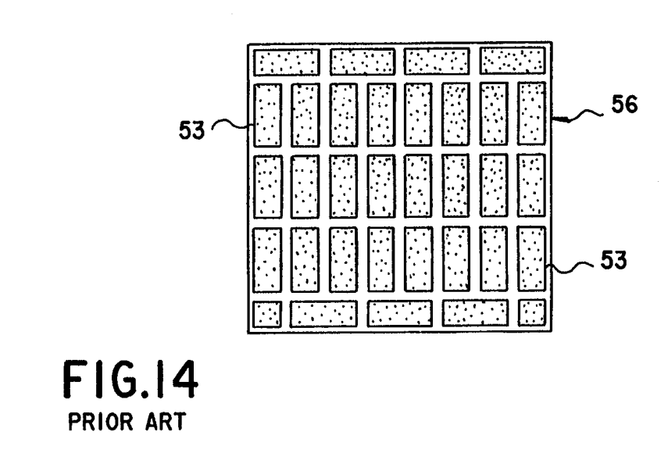
FIG. 14 is a plan view showing one example of a ceramic substrate on the heat-absorbing side which is used in the conventional thermoelectric conversion module.
Figure 15:
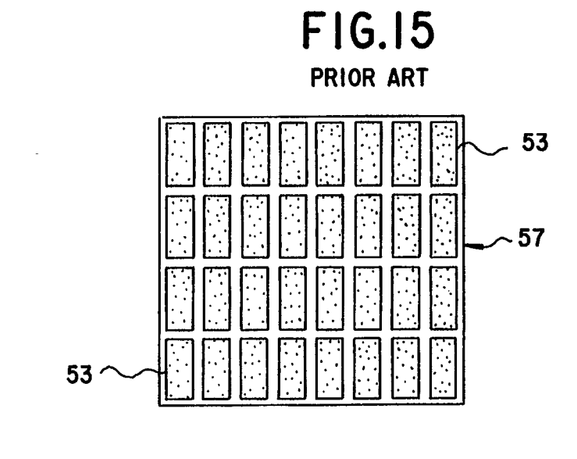
FIG. 15 is a plan view showing one example of a ceramic substrate on the heat-generating side which is used in the conventional thermoelectric conversion module.

Description is now made of a conventional method of fabricating the above described thermoelectric conversion module. FIG. 14 shows the ceramic substrate on the heat-absorbing side 56, and FIG. 15 shows the ceramic substrate on the heat-generating side 57. In the ceramic substrates 56 and 57, leads 53 constructed as shown in FIGS. 14 and 15 are respectively formed as interconnection patterns. The P-type thermoelectric semiconductor chips 51 and the N-type thermoelectric semiconductor chips 52 are arranged as described above between the pair of ceramic substrates 56 and 57, and are soldered therebetween, thereby to assemble the thermoelectric conversion module as shown in FIG. 13. In this case, the P-type thermoelectric semiconductor chips 51 and the N-type thermoelectric semiconductor chips 52 are alternately arranged in both the longitudinal and the transverse directions.

Figure 16:
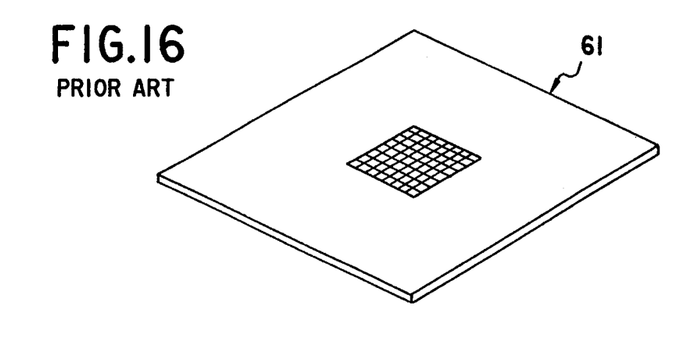
FIG. 16 is a diagram for explaining one example of a positioning jig which is used in a method of fabricating the conventional thermoelectric conversion module.
Figure 17:
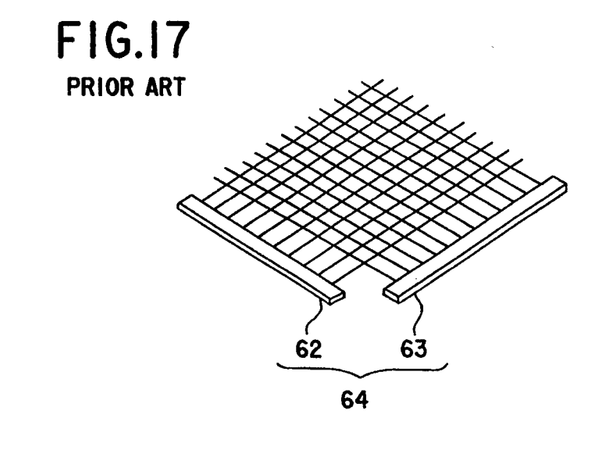
FIG. 17 is diagram for explaining another example of a positioning jig which is used in a method of fabricating the conventional thermoelectric conversion module.

Meanwhile, in alternately arranging the above described P-type thermoelectric semiconductor chips 51 and the above described N-type thermoelectric semiconductor chips 52, a jig 61 provided with cell-shaped punching holes corresponding to the sizes of the chips 51 and 52 as shown in FIG. 16 and a jig 64 provided with cells by crossing a pair of comb-shaped members 62 and 63 at right angles as shown in FIG. 17 are used to perform the work of inserting the chips 61 and 52 into the cells.

In this case, attempts to making the thermoelectric conversion module small in size bring about the necessity of making the chips 51 and 52 smaller in size. Consequently, assembling work using a microscope is required. In this case, therefore, there occurs the disadvantage that a lot of trouble is required for the assembling work. In addition, the P-type thermoelectric semiconductor chips 51 and the N-type thermoelectric semiconductor chips 52 having the same shape and the same color must be alternately arranged. Accordingly, there may arise the problem in quality that the chips 51 and 52 are arranged in erroneous positions.

Moreover, an assembling jig for a small-sized module must be fabricated using a special method such as electric discharge machining (EDM) because their fine portions require high precision. Consequently, the jig is higher in cost, causing a higher cost of the thermoelectric conversion module.

SUMMARY OF THE INVENTION

The present invention has been made so as to eliminate the above described conventional disadvantages and has for its object to provide a thermoelectric conversion module and method of fabricating the same capable of reliably preventing the problem in quality as well as capable of achieving high efficiency and low cost even in the case of making the size smaller.

The present invention provides a thermoelectric conversion module in which P-type thermoelectric semiconductor chips and N-type thermoelectric semiconductor chips are arranged in both the longitudinal and the transverse directions between a pair of substrates and are alternately electrically connected to absorb heat on one of the substrates and to generate heat on the other substrate, which is characterized by having in at least a part a same type arrangement portion formed by providing a plurality of thermoelectric semiconductor chips of the same type side by side with predetermined spacing in the longitudinal or the transverse direction.

Furthermore, the present invention provides a thermoelectric conversion module in which P-type thermoelectric semiconductor chips and N-type thermoelectric semiconductor chips are arranged in both the longitudinal and the transverse directions between a pair of substrates and are alternately electrically connected to absorb heat on one of the substrates and to generate heat on the other substrate, which is characterized in that all chips in at least one of the rows or columns of the above chips are constituted by P-type thermoelectric semiconductors and all chips in at least one of the rows or columns of chips adjacent to the above row or column of chips are constituted by N-type thermoelectric semiconductors.

The above described thermoelectric conversion module is characterized in that all the above described rows or columns of chips are either the rows or columns of chips constituted by the P-type thermoelectric semiconductors or the rows or columns of chips constituted by the N-type thermoelectric semiconductors, and both the rows or columns of chips are alternately arranged.

The present invention provides a method of fabricating a thermoelectric conversion module in which P-type thermoelectric semiconductor chips and N-type thermoelectric semiconductor chips are arranged in both the longitudinal and the transverse directions between a pair of substrates and are alternately electrically connected to absorb heat on one of the substrates and to generate heat on the other substrate, which is characterized by comprising the steps of disposing, on a first substrate having a pattern formed by providing side by side with predetermined spacing a plurality of leads for connecting a pair of a bar-shaped P-type thermoelectric semiconductor and a bar-shaped N-type thermoelectric semiconductor to each other, the P-type thermoelectric semiconductor and the N-type thermoelectric semiconductor having such a length that they can be brought into contact with all of the above leads provided side by side or a particular number thereof with predetermined spacing in a state where the P-type thermoelectric semiconductor and the N-type thermoelectric semiconductor can be connected to each other by at least parts of the leads, joining the P-type thermoelectric semiconductor and the N-type thermoelectric semiconductor to the leads, electrically disconnecting the above P-type thermoelectric semiconductor and the above N-type thermoelectric semiconductor to be brought into P-type thermoelectric semiconductor chips and N-type thermoelectric semiconductor chips in positions between the above leads provided side by side, and joining to the above P-type thermoelectric semiconductor chips and the above N-type thermoelectric semiconductor chips leads for connecting a P-type thermoelectric semiconductor chip and an N-type thermoelectric semiconductor chip to each other on a second substrate having a pattern other than the above pattern.

The above described method of fabricating a thermoelectric conversion module is characterized in that a plurality of patterns on the above described first substrate are also arranged in the direction crossing at right angles to the direction in which the leads are provided side by side, and a bar-shaped P-type thermoelectric semiconductor and a bar-shaped N-type thermoelectric semiconductor are arranged in each of the patterns.

Furthermore, the above described method of fabricating a thermoelectric conversion module is characterized in that the P-type thermoelectric semiconductors and the N-type thermoelectric semiconductors are electrically disconnected in the positions between the above described leads using a cutter comprising a plurality of cutting edges arranged with predetermined spacing.

In the thermoelectric conversion module according to the present invention, particular parts or all of the P-type thermoelectric semiconductor chips or the N-type thermoelectric semiconductor chips of the same type are arranged in rows or columns, thereby to improve the efficiency of assembling work as well as to make it possible to reduce the frequency of the occurrence of the problem in quality that erroneous types of chips are arranged, as compared with the conventional case where all of them are alternately arranged.

In the method of fabricating a thermoelectric conversion module according to the present invention, the bar-shaped P-type thermoelectric semiconductor and the bar-shaped N-type thermoelectric semiconductor are used and are joined to the substrate and then, the P-type thermoelectric semiconductor and the N-type thermoelectric semiconductor are disconnected in their middle parts to be brought into chips, thereby to significantly improve assembling and joining workability, as compared with the conventional case where chip-shaped semiconductors are individually assembled and joined. In addition, the bar-shaped P-type thermoelectric semiconductor and the bar-shaped N-type thermoelectric semiconductor may be positioned, thereby to make it possible to simplify a positioning jig.

Furthermore, the method of fabricating a thermoelectric conversion module is suitable for the fabrication of a large capacity thermoelectric conversion module.

Additionally, in the method of fabricating a thermoelectric conversion module, the disconnecting work can be performed for a short time, thereby to make it possible to fabricate the thermoelectric conversion module at much higher efficiency.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

Figure 1:
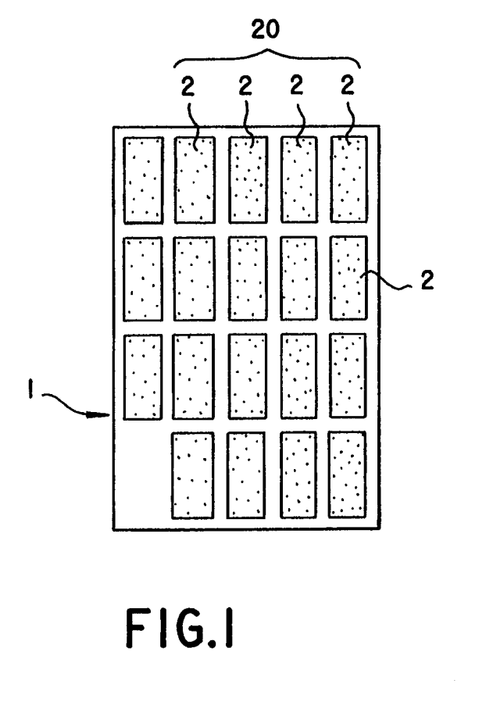
FIG. 1 is a plan view showing one example of a ceramic substrate on the heat-generating side which is used for carrying out a method of fabricating a thermoelectric conversion module according to the present invention.

FIG. 1 shows a ceramic substrate on the heat-generating side 1. The ceramic substrate 1 comprises an interconnection pattern 20 so constructed that a total of 19 rectangular leads 2 are almost equally spaced in both the longitudinal and the transverse directions.

Figure 2:
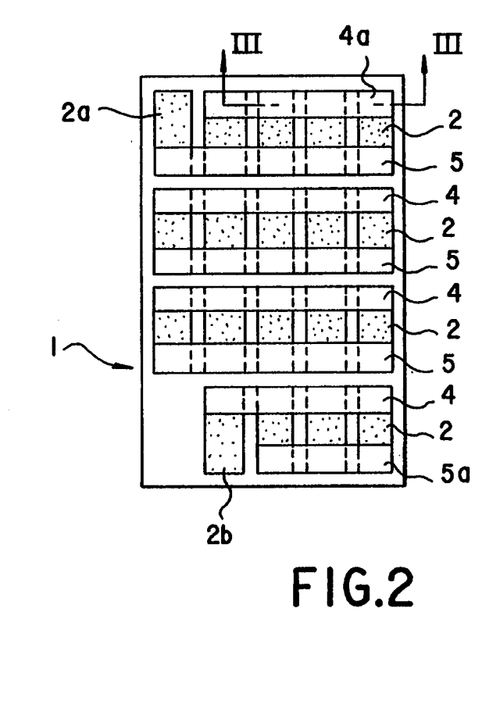
FIG. 2 is a plan view showing a state where bar-shaped N-type thermoelectric semiconductors and bar-shaped P-type thermoelectric semiconductors are disposed on the ceramic substrate on the heat-generating side shown in FIG. 1.

Then, bar-shaped N-type thermoelectric semiconductors 4 and bar-shaped P-type thermoelectric semiconductors 5 are alternately disposed on the above described ceramic substrate on the heat-generating side 1, as shown in FIG. 2. The N-type thermoelectric semiconductors 4 and the P-type thermoelectric semiconductors 5, except for their parts 4a and 5a, have such a length that they can be connected to all leads 2 provided side by side in the transverse direction. In addition, both the thermoelectric semiconductors 4 and 5 are arranged with predetermined spacing and so as to be connected to each other by the common leads 2 except for their parts 2a and 2b. In this state, the N-type thermoelectric semiconductors 4 and the P-type thermoelectric semiconductors 5 are soldered to the above described ceramic substrate on the heat-generating side 1. Meanwhile, the above described extra leads 2a and 2b on which the thermoelectric semiconductors 4a and 5a are not arranged are used for connecting lead wires as described later.

Figure 3:
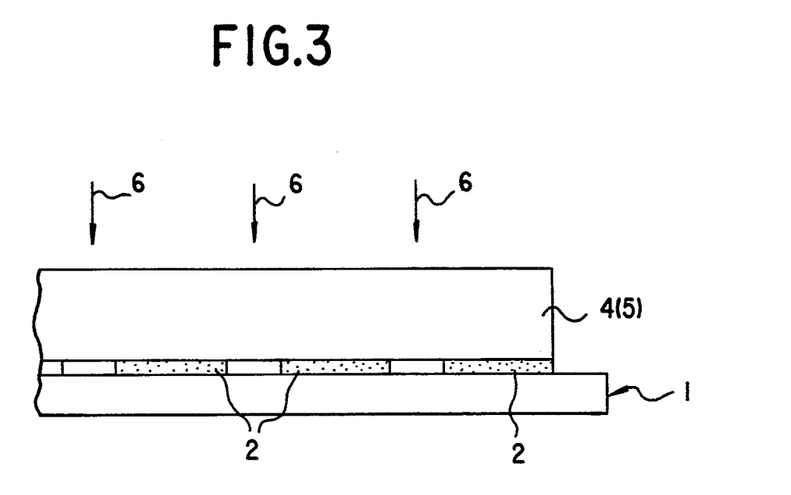
FIG. 3 is a vertical sectional view showing a state where the bar-shaped N-type thermoelectric semiconductor and the bar-shaped P-type thermoelectric semiconductor are joined to the ceramic substrate on the heat-generating side shown in FIG. 1.
Figure 4:
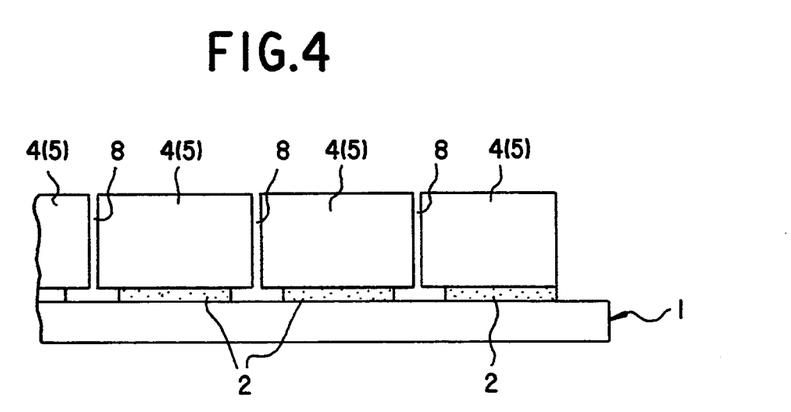
FIG. 4 is a vertical sectional view showing a state where the bar-shaped N-type thermoelectric semiconductor and the bar-shaped P-type thermoelectric semiconductor are disconnected.
Figure 5:
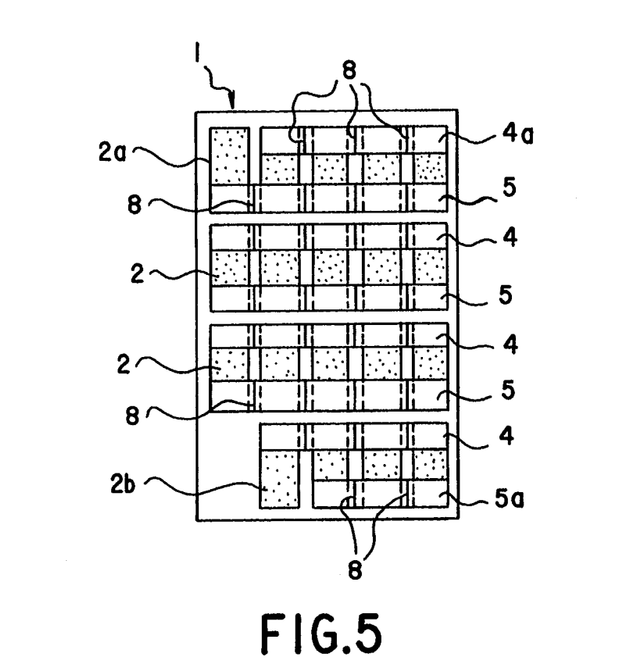
FIG. 5 is a plan view showing a state after the bar-shaped N-type thermoelectric semiconductors and the bar-shaped P-type thermoelectric semiconductors are disconnected.

Thereafter, the above described bar-shaped N-type thermoelectric semiconductor 4 and P-type thermoelectric semiconductor 5 are cut by a cutter having a plurality of cutting edges 6 in positions between the above described leads 2, as shown in FIG. 3. Furthermore, in the case of the cutting, the cutting edges 6 are pushed to a state where they are in close proximity to the ceramic substrate 1 or are slightly brought into contact with the surface of the ceramic substrate 1, to bring the N-type thermoelectric semiconductors 4 and the P-type thermoelectric semiconductors 5 into a state where they are electrically disconnected in cut portions 8, as shown in FIGS. 4 and 5. Electric discharge machining may be used in thus disconnecting the thermoelectric semiconductors 4 and 5.

Figure 6:
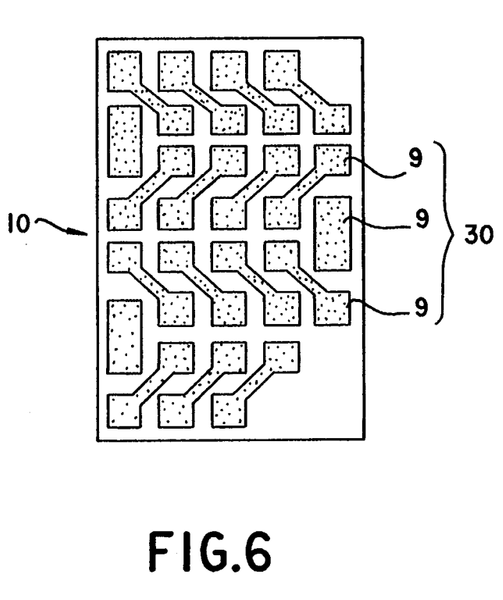
FIG. 6 is a plan view showing one example of a ceramic substrate on the heat-absorbing side which is used for carrying out the method of fabricating a thermoelectric conversion module according to the present invention.

On the other hand, a ceramic substrate on the heat-absorbing side 10 having an interconnection pattern 30 of a construction that leads 9 are arranged as shown in FIG. 6 is prepared, and is soldered to the above described N-type thermoelectric semiconductors 4 and P-type thermoelectric semiconductors 5 in a chip shape.

Figure 7:
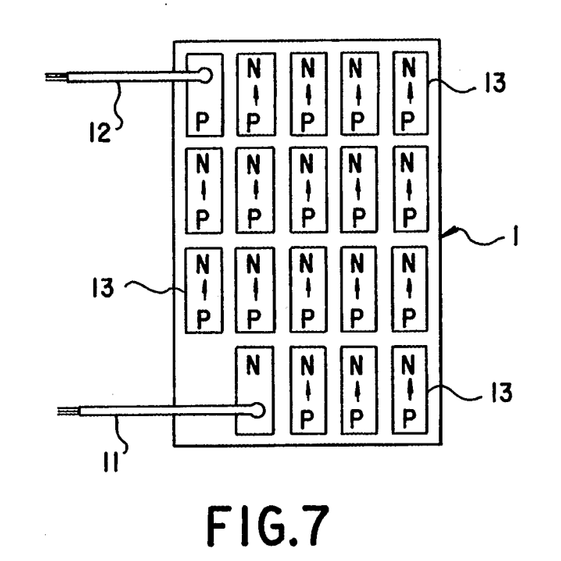
FIG. 7 is a plan view showing how heat-generating modules formed on the ceramic substrate on the heat-generating side shown in FIG. 1 are arranged.
Figure 8:
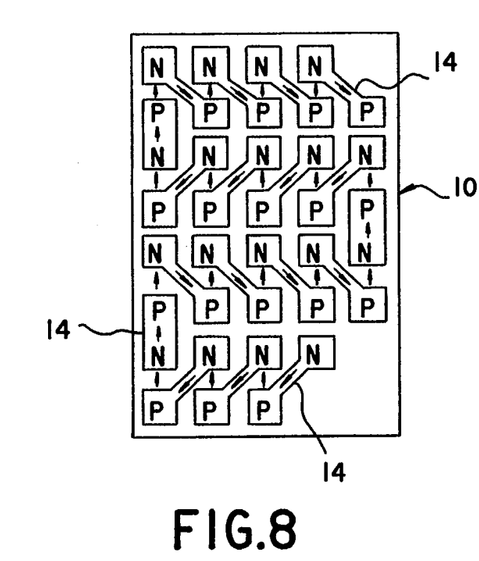
FIG. 8 is a plan view showing how heat-absorbing modules formed on the ceramic substrate on the heat-absorbing side shown in FIG. 6 are arranged.

In the thermoelectric conversion module obtained in the above described manner, 18 couples of heat-generating modules 13 are formed, as shown in FIG. 7, on the ceramic substrate on the heat-generating side 1, while 18 couples of heat-absorbing modules 14 are formed, as shown in FIG. 8, on the ceramic substrate on the heat-absorbing side 10. In FIG. 7, reference numerals 11 and 12 respectively denote a plus-side lead wire and a minus-side lead wire.

Figure 9:
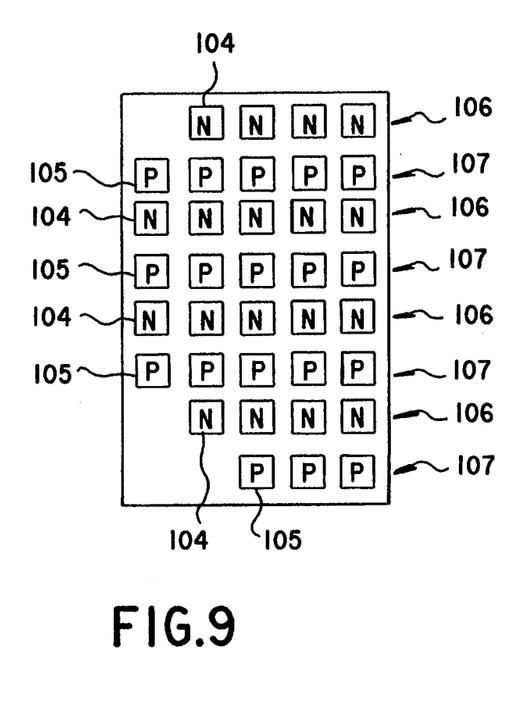
FIG. 9 is a schematic diagram showing a state where N-type thermoelectric semiconductor chips and P-type thermoelectric semiconductor chips in the thermoelectric conversion module are arranged.

FIG. 9 schematically shows a state where N-type thermoelectric semiconductor chips 104 and P-type thermoelectric semiconductor chips 105 are arranged in the thermoelectric conversion module obtained in the above described fabricating method. As shown in FIG. 9, in this thermoelectric conversion module, all parts of a row of chips are constituted by the N-type thermoelectric semiconductor chips 104 or the P-type thermoelectric semiconductor chips 105. In addition, a row of chips 106 constituted by the N-type thermoelectric semiconductors and a row of chips 107 constituted by the P-type thermoelectric semiconductors are alternately arranged in the longitudinal direction. The arrangement of the chips 104 and 105 in such forms has the advantages that the efficiency of assembling work can be improved and the frequency of the occurrence of the problem in quality that erroneous types of chips are arranged in not only a case where the thermoelectric conversion module is fabricated in the above described method but also a case where the N-type thermoelectric semiconductor chips 104 and the P-type thermoelectric semiconductor chips 105 previously cut in a chip shape are used and are arranged and assembled in the same method as the conventional case.

Figure 10:
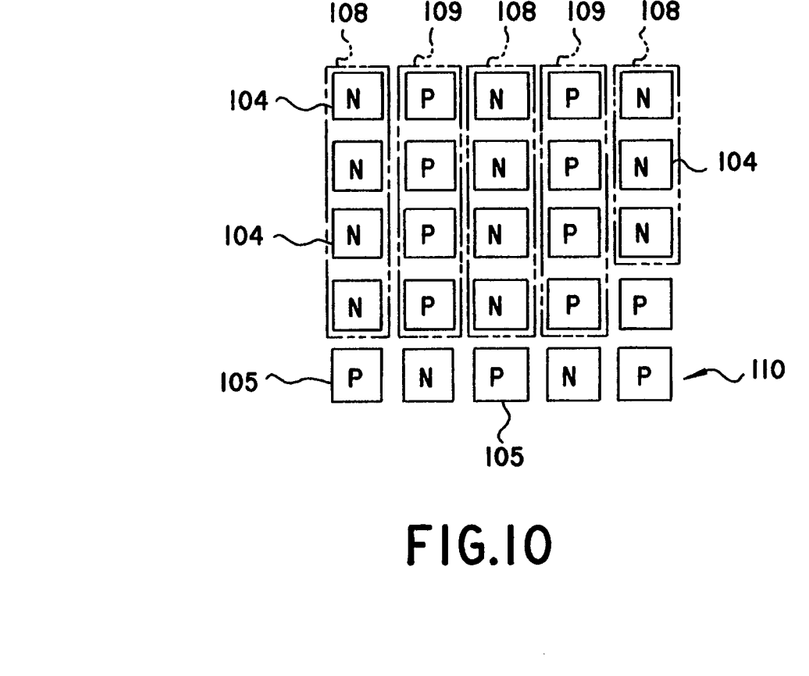
FIG. 10 is a schematic diagram showing a modified example of a state where N-type thermoelectric semiconductor chips and P-type thermoelectric semiconductor chips in another thermoelectric conversion module are arranged.

The same advantages as the foregoing are obtained almost similarly in a thermoelectric conversion module comprising N-type thermoelectric semiconductor chips 104 and P-type thermoelectric semiconductor chips 105 arranged as shown in, for example, in FIG. 10. When the respective five chips are arranged in both the longitudinal and the transverse directions, a same type arrangement portion 108 constituted by the N-type thermoelectric semiconductor chips 104 is formed by arranging the four N-type thermoelectric semiconductor chips 104 side by side with predetermined spacing in the longitudinal direction, a same type arrangement portion 109 constituted by the P-type thermoelectric semiconductor chips 105 adjacent to the same type arrangement portion 108 is similarly formed, and the same type arrangement portions 108 and 109 are alternately arranged in the transverse direction. More specifically, all parts of a row or column of chips are not constituted by the thermoelectric semiconductor chips of the same type but parts thereof are constituted by the thermoelectric semiconductor chips of the same type. In, for example, the lowermost row of chips 110, the N-type thermoelectric semiconductor chips 104 and the P-type thermoelectric semiconductor chips 105 are arranged at random in consideration of pulling out lead wires.

The above described same type arrangement portions 108 and 109 in the thermoelectric conversion module can be formed in the above described method. In addition, even when the N-type thermoelectric semiconductor chips and the P-type thermoelectric semiconductor chips 105 previously cut are used and are arranged and assembled in the same method as the conventional case, the advantages are maintained that the efficiency of assembling work can be improved and the frequency of the occurrence of the problem in quality can be reduced.

Although in FIG. 10, the number of the same type arrangement portions 108 and 109 is five, it is obvious that the number of the same type arrangement portions 108 and 109 to be formed can be arbitrarily changed.

Figure 11:
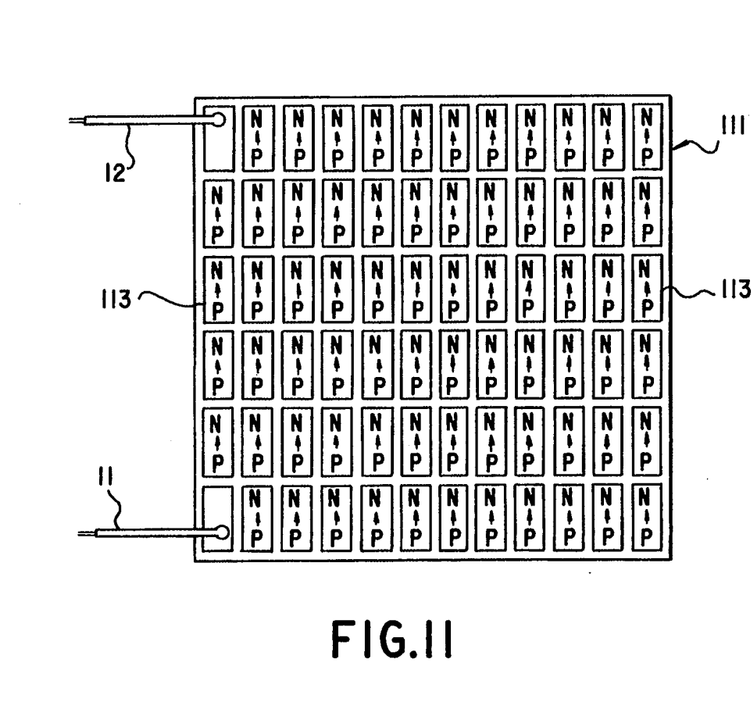
FIG. 11 is a plan view showing a modified example of the pattern on a ceramic substrate on the heat-generating side.
Figure 12:
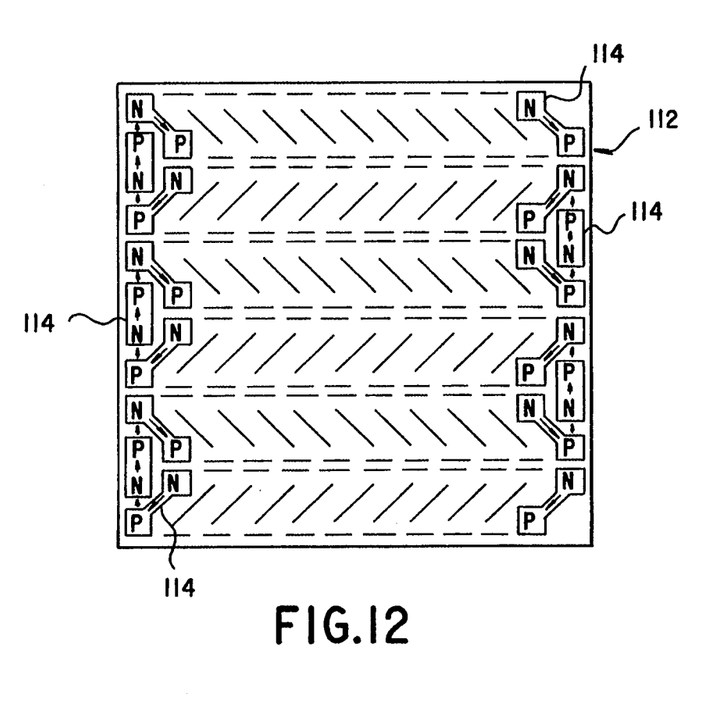
FIG. 12 is a plan view showing a modified example of the pattern on a ceramic substrate on the heat-absorbing side.

FIGS. 11 and 12 show another modified example of a thermoelectric conversion module. The thermoelectric conversion module has 71 couples of heat-generating and heat-absorbing modules. FIG. 11 shows a ceramic substrate on the heat-generating side 111, and FIG. 12 shows a ceramic substrate on the heat-absorbing side 112. Reference numerals 113 and 114 respectively denote a heat-generating module and a heat-absorbing module. In addition, reference numerals 11 and 12 denote the same lead wires as those shown in FIG. 7. Also in the thermoelectric conversion module, exactly the same function and effect as those of the thermoelectric conversion module shown in FIGS. 7 and 8 are obtained.

Although description was made of one embodiment of a thermoelectric conversion module according to the present invention and a method of fabricating the same, the present invention is not limited to the above described embodiment. More specifically, the present invention can be practiced by making various modifications. For example, although the aligned leads 2 in the pattern 20 are formed on the ceramic substrate on the heat-generating side 1 and the bar-shaped N-type thermoelectric semiconductors 4 and the bar-shaped P-type thermoelectric semiconductors 5 are soldered to the ceramic substrate 1, the present invention can be practiced in exactly the same manner as the foregoing if the same aligned leads 2 in the pattern are formed on the ceramic substrate on the heat-absorbing side 10 and the order of arrangement of the N-type thermoelectric semiconductors 4 and the P-type thermoelectric semiconductors 5 is reverse to the above described order of arrangement. In addition, the patterns comprising the leads on the ceramic substrate on the heat-generating side 1 and the ceramic substrate on the heat-absorbing side 10 can be formed by making various modifications. Furthermore, the thermoelectric conversion module also includes one fabricated by not using bar-shaped thermoelectric semiconductors but using thermoelectric semiconductor chips previously cut, as described above.

In the thermoelectric conversion module according to the present invention, particular parts or all of the P-type thermoelectric semiconductor chips or the N-type thermoelectric semiconductor chips of the same type are arranged in rows or columns. Accordingly, the efficiency of assembling work is improved and the frequency of the occurrence of the problem in quality that erroneous types of chips are arranged can be reduced, as compared with the conventional case where all of them are alternately arranged.

In the method of fabricating a thermoelectric conversion module according to the present invention, the bar-shaped P-type thermoelectric semiconductor and the bar-shaped N-type thermoelectric semiconductor are joined to the substrate and then, are separated in their middle parts to be brought into chips. Consequently, the assembling and joining workability can be significantly improved, as compared with the conventional case where the chip-shaped semiconductors are individually assembled and joined, thereby to make it possible to improve the efficiency of the fabrication. In addition, the bar-shaped P-type thermoelectric semiconductors and the bar-shaped N-type thermoelectric semiconductors may be positioned, thereby to make it possible to make a positioning jig simple and low in cost. As a result, the fabrication cost of the thermoelectric conversion module can be reduced.

Furthermore, in the method of fabricating the thermoelectric conversion module, a large capacity thermoelectric conversion module can be fabricated at high efficiency.

Additionally, in the method of fabricating the thermoelectric conversion module, highly efficient disconnecting work can be performed, thereby to make it possible to fabricate the thermoelectric conversion module at higher efficiency.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A thermoelectric conversion module comprising:
   a pair of substrates; and
   P-type thermoelectric semiconductor chips and N-type thermoelectric semiconductor chips arranged in both longitudinal and transverse directions between said pair of substrates and all chips being electrically connected in series to absorb heat on one of the substrates and to generate heat on the other substrate,
   wherein the thermoelectric conversion module having in at least a part a same type arrangement portion formed by providing a plurality of thermoelectric semiconductor chips of a same type side by side with predetermined spacing in one of the longitudinal and the transverse directions.

2. A thermoelectric conversion module comprising:
   a plurality of substrates; and
   P-type thermoelectric semiconductor chips and N-type thermoelectric semiconductor chips arranged in both longitudinal and transverse directions between said pair of substrates and all chips being electrically connected in series to absorb heat on one of the substrates and to generate heat on the other substrate,
   wherein all said semiconductor chips in at least one row and column of said semiconductor chips are constituted by P-type thermoelectric semiconductors, and all said semiconductor chips in at least one of said rows and columns of said semiconductor chips adjacent to said one row or column of said semiconductor chips are constituted by N-type thermoelectric semiconductors.

3. The thermoelectric conversion module according to claim 2, wherein said rows and columns of semiconductor chips are one of the rows and columns of chips constituted by the P-type thermoelectric semiconductors and the rows and columns of chips constituted by the N-type thermoelectric semiconductors, and both the rows and columns of semiconductor chips are alternately arranged.

* * * * *